(12) United States Patent
Nakamura

(10) Patent No.: US 9,142,605 B2
(45) Date of Patent: Sep. 22, 2015

(54) DISPLAY PANEL AND PANEL INSPECTION APPARATUS

(71) Applicant: Sony Corporation, Tokyo (JP)

(72) Inventor: Kazuo Nakamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/585,993

(22) Filed: Dec. 30, 2014

(65) Prior Publication Data

US 2015/0108464 A1    Apr. 23, 2015

Related U.S. Application Data

(63) Continuation of application No. 14/273,638, filed on May 9, 2014, now Pat. No. 8,963,418, which is a continuation of application No. 13/648,332, filed on Oct. 10, 2012, now Pat. No. 8,760,047, which is a continuation of application No. 12/230,085, filed on Aug. 22, 2008, now Pat. No. 8,508,123.

(30) Foreign Application Priority Data

Sep. 12, 2007    (JP) ................................. 2007-237270

(51) Int. Cl.
| | |
|---|---|
| H01L 51/52 | (2006.01) |
| H05B 33/02 | (2006.01) |
| H01L 27/32 | (2006.01) |
| G02F 1/13 | (2006.01) |
| G09G 3/00 | (2006.01) |
| H04N 17/04 | (2006.01) |
| G09G 3/12 | (2006.01) |

(52) U.S. Cl.
CPC .......... *H01L 27/3276* (2013.01); *G02F 1/1309* (2013.01); *G09G 3/006* (2013.01); *G09G 3/12* (2013.01); *H04N 17/04* (2013.01)

(58) Field of Classification Search
CPC ...... H01L 27/3276; G09G 3/12; G09G 3/006; G02F 1/1309; H04N 17/04
See application file for complete search history.

(56) References Cited

U.S. PATENT DOCUMENTS

| | | | |
|---|---|---|---|
| 6,115,017 | A | 9/2000 | Mikami et al. |
| 6,597,427 | B1 | 7/2003 | Katsu et al. |
| 7,023,234 | B2 | 4/2006 | Tomita |
| 7,106,089 | B2 | 9/2006 | Nakano et al. |
| 7,212,025 | B2 | 5/2007 | Tomita |

(Continued)

FOREIGN PATENT DOCUMENTS

| | | |
|---|---|---|
| JP | 07-014437 A | 1/1995 |
| JP | 08-022025 A | 1/1996 |

(Continued)

OTHER PUBLICATIONS

Japanese Office Action issued Aug. 25, 2009 for corresponding Japanese Application No. 2007-237270.

*Primary Examiner* — Donald Raleigh
(74) *Attorney, Agent, or Firm* — Fishman Stewart Yamaguchi PLLC

(57) ABSTRACT

Disclosed herein is a display panel based on active matrix driving having a display area made up of N pixel control lines, M video signal lines orthogonally intersecting the N pixel control lines, and pixel circuits arranged at intersections between the N pixel control lines and M video signal lines, wherein positional identification patterns are arranged on every k (k being a natural number) pixel control lines inside each of the pixel circuits.

23 Claims, 18 Drawing Sheets

(56) References Cited

U.S. PATENT DOCUMENTS

| | | |
|---|---|---|
| 7,317,326 B2 | 1/2008 | Nakano et al. |
| 2004/0119920 A1 | 6/2004 | Uesaka et al. |
| 2005/0078073 A1 | 4/2005 | Mikami et al. |
| 2005/0237211 A1 | 10/2005 | Sato et al. |
| 2006/0055864 A1 | 3/2006 | Matsumura et al. |
| 2006/0125510 A1 | 6/2006 | Brunner et al. |
| 2006/0284175 A1 | 12/2006 | Hiramatsu et al. |
| 2007/0146251 A1 | 6/2007 | Tsuge et al. |

FOREIGN PATENT DOCUMENTS

| | | |
|---|---|---|
| JP | 2001-033810 A | 2/2001 |
| JP | 2003-050380 A | 2/2003 |
| JP | 2004-102260 A | 4/2004 |
| JP | 2004-347749 A | 12/2004 |
| WO | WO-2006/100861 A1 | 9/2006 |
| WO | WO-2007/013528 A1 | 2/2007 |

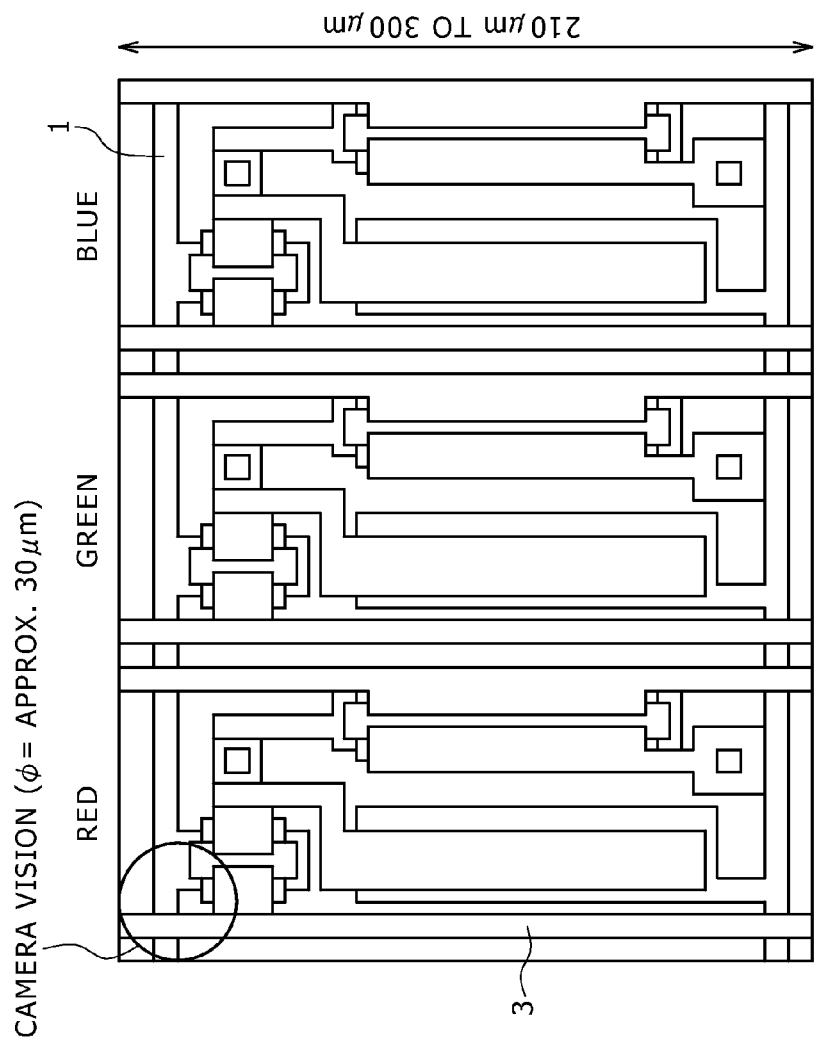

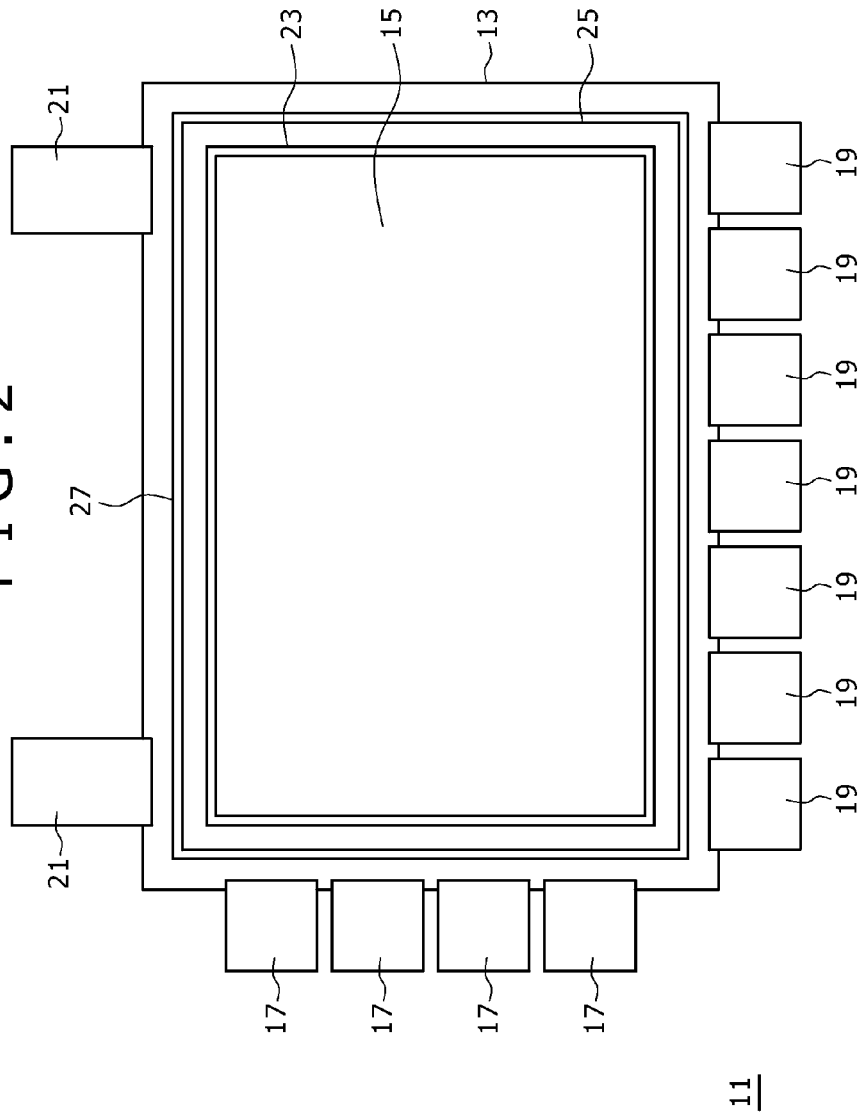

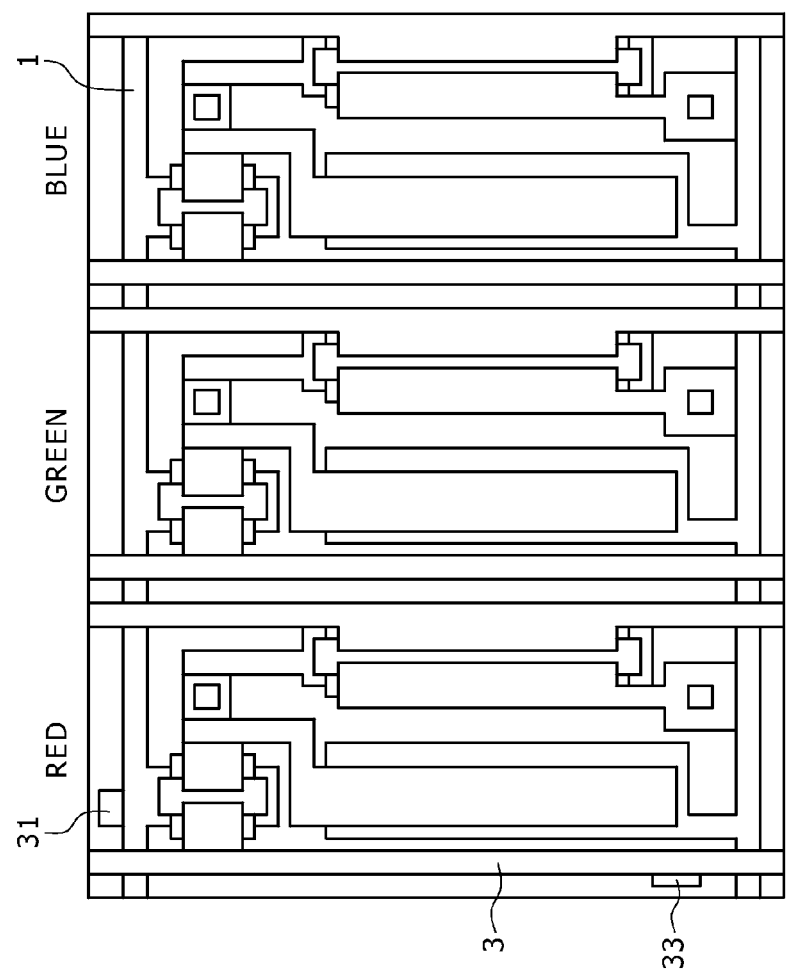

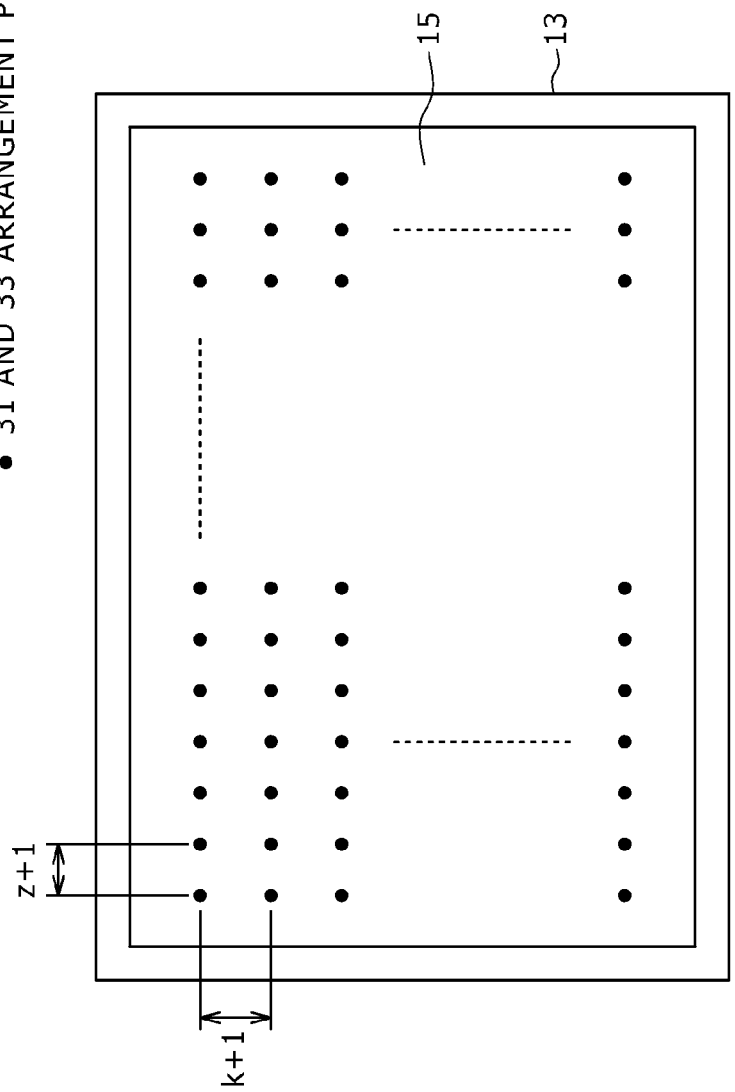

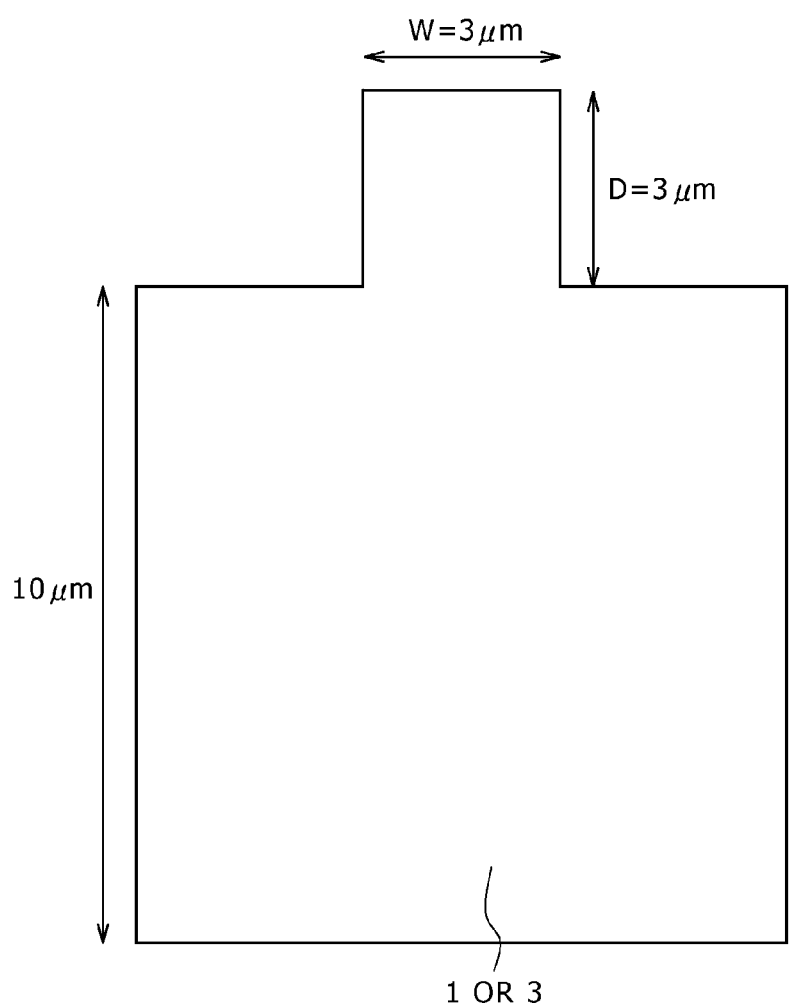

US 9,142,605 B2

DISPLAY PANEL AND PANEL INSPECTION APPARATUS

CROSS REFERENCES TO RELATED APPLICATIONS

This is a Continuation Application of U.S. patent application Ser. No. 14/273,638 filed May 9, 2014, which is a Continuation Application of Ser. No. 13/648,332, filed Oct. 10, 2012, now U.S. Pat. No. 8,760,067, issued on Jun. 24, 2014, which is a Continuation Application of U.S. patent application Ser. No. 12/230,085, filed Aug. 22, 2008, now U.S. Pat. No. 8,508,123, issued on Aug. 13, 2013, which in turn claims priority from Japanese Application No.: 2007-237270 filed in the Japan Patent Office on Sep. 12, 2007, the entire contents of which being incorporated herein by reference.

BACKGROUND OF THE INVENTION

1. Field of the Invention

The present invention relates to a technology configured to identify the pixel position of a display panel of active matrix drive type in a short time. It should be noted that the present invention has a mode as both a display panel and a panel inspection apparatus.

2. Description of the Related Art

Recently, various types of display technologies have been proposed as FPDs (Flat Panel Displays). For example, these display technologies include non-self-illuminating display technologies, such as LCD (Liquid Crystal Display), that use backlighting and self-illuminating display technologies, such as plasma display and organic EL (Electro Luminescence) display.

The flat panel displays are based on the passive matrix driving and the active matrix driving. Recently, the active matrix driving has gained the mainstream.

The following describes the existing structure and technological problems of a pixel circuit based on the active matrix driving by uses of an organic EL display for an example.

Referring to FIG. 1, there is shown a top view of an exemplary configuration of a pixel circuit. It should be noted that FIG. 1 shows a pattern example in which one pixel is composed of three sub pixels. These three sub pixels are the three primary colors; R (Red), G (Green), and Blue (Blue).

As shown in FIG. 1, a pixel control line 1 is arranged so as to cross two or more sub pixels and a video signal line 3 corresponding to each sub pixel is arranged so as to orthogonally cross the pixel control line 1. In addition, a thin-film transistor is arranged in each sub pixel circuit, the thin-film transistor being connected to the pixel control line 1 and the video signal line 3. It should be noted that the configuration itself in each pixel circuit is known.

With today's display apparatuses, the display area is getting increasing and the display resolution is getting increasingly finer, thereby necessarily making the pixel pitch increasingly narrower. This situation raises the probability of the occurrence of defects, such as the broken wires due to dust or the like during manufacturing processes of display panels, the short-circuits between adjacent wires, and inter-layer short-circuits in wire cross sections, for example.

Especially, defects encountered in the forming of the wiring in semiconductor transistors, for example, are fatal. Hence, electrical inspections have to be executed after each thin-film transistor film forming process to detect failing points and repair the detected failures.

For the above-mentioned purpose, various electrical inspection methods have been proposed (Japanese Patent Laid-Open No. 2004-102260, Japanese Patent Laid-Open No. 2004-347749, and Japanese Patent Laid-Open No. 2003-50380).

SUMMARY OF THE INVENTION

Generally, defective locations are identified by use of any of above-mentioned inspection methods and the detected defectives are repaired by use of lasers. It should be noted here that large-scale display apparatuses as often found today desire a large movement of the laser radiation muzzle or a camera attached thereto.

In addition, it is not desired in terms of production takt time to desire a precise alignment operation every time a failing point is detected and repaired. Also, as shown in FIG. 1, while the pixel pitch is approximately 200 μm, the diameter of camera viewing field is approximately 30 μm.

This is because each failing point is normally less than 30 μm. However, in this viewing field range, it takes a very long time to detect or repair many failing points in the display area.

Therefore, the embodiment of the present invention addresses the above-identified and other problems associated with related-art methods and apparatuses and solves the addressed problems by proposing a display panel based on active matrix driving made up of N pixel control lines, M video signal lines that orthogonally intersect the N pixel control lines, and pixel circuits arranged at the intersections between the N pixel control lines and M video signal lines. In this display panel, positional identification patterns are arranged on every k (k being a natural number) pixel control lines inside each of the pixel circuits.

At the same time, the embodiment of the present invention addresses the above-identified and other problems associated with related-art methods and apparatuses and solves the addressed problems by proposing a display panel based on active matrix driving made up of N pixel control lines, M video signal lines that orthogonally intersect the N pixel control lines, and pixel circuits arranged at the intersections between the N pixel control lines and M video signal lines. In this display panel, positional identification patterns are arranged on every z (z being a natural number) video signal lines inside each of the pixel circuits.

Obviously, the pattern structure for positional identification can be arranged on both the pixel control lines and the video signal lines. It should be noted that the pattern structure may be convex or concave in shape.

Arranging (into each pixel circuit) the positional identification pattern proposed by the applicant hereof into a display area significantly reduces the time necessary for failure point detection and repair, thereby significantly enhancing a manufacturing takt time.

BRIEF DESCRIPTION OF THE DRAWINGS

FIG. 1 is a schematic diagram illustrating an exemplary planar configuration of a related-art pixel circuit;

FIG. 2 is a schematic diagram illustrating an exemplary planar configuration of a display panel module;

FIG. 3 is a schematic diagram illustrating an exemplary planar configuration of a pixel circuit described in an example of form;

FIG. 4 is a schematic diagram illustrating an exemplary arrangement of a positional identification pattern;

FIG. 5 is a schematic diagram illustrating exemplary real dimensions of a positional identification pattern;

DETAILED DESCRIPTION OF THE PREFERRED EMBODIMENTS

Figure 6A:
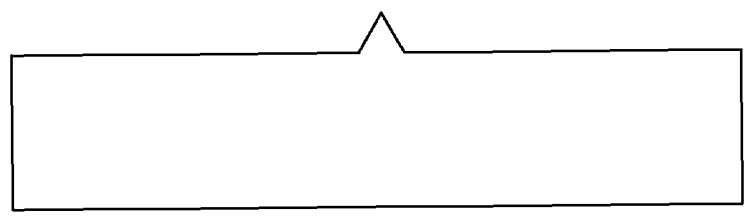
FIGS. 6A through 6D are schematic diagrams illustrating exemplary forms of positional identification patterns.

The embodiment of the present invention will be described in further detail, with reference to the accompanying drawings, by way of embodiments thereof in which the invention is embodied in organic EL panels based active matrix driving. It should be noted that, to any portions not especially illustrated or described herein, known or publicly known technologies in technological fields concerned are applied. It should also be noted that the embodiments described below are illustrative and therefore the embodiment of the present invention is not restricted thereto.

(A) Overall Configuration

Referring to FIG. 2, there is shown an exemplary planar configuration of an organic EL module 11. The organic EL module 11 has a configuration in which a display area 15 arranged with pixel circuits based on active driving in a matrix is formed on a glass substrate 13.

It should be noted that scan signal supply TABs 17, video signal supply TABs 19, and power supply TCPs 21 are connected to the display area 15 at the outer periphery thereof. N pixel control lines 1 and M video signal lines 3 are connected to the connection pad of each wire. It should be noted that an organic film 23 greater than the display area 15 by approximately 1 to 2 mm is formed. In addition, a cathode film 25 is formed around the organic film 23. Although not shown, an opposite glass 27 coated with a sealant is mounted on the cathode film 25.

(B) Configuration of the Organic EL Panel (B-1) Exemplary Embodiment

Referring to FIG. 3, there is shown an exemplary planar configuration of a pixel circuit making up an organic EL panel practiced as one embodiment of the invention. It should be noted that, with reference to FIG. 3, components similar to those previous described with reference to FIG. 1 are demoted by the same reference numerals.

Also in an example shown in FIG. 3, the pixel control line 1 is arranged so as to intersect two or more sub pixels and the video signal line 3 corresponding to each sub pixel is arranged so as to orthogonally intersect the pixel control line 1. In each sub pixel circuit, a thin-film transistor is arranged and connected to the pixel control line 1 and the video signal line 3.

However, in the pixel circuit associated with the above-mentioned embodiment, positional identification patterns (projection patterns 31 and 33) are arranged for every several of the pixel control lines 1 and the video signal lines 3. For example, as shown in FIG. 4, the projection pattern 31 to be formed on the pixel control lines 1 is arranged every k (k being a natural number) pixel control lines. Also, for example, the projection pattern 33 to be formed on the video signal lines 3 is arranged every z (z being a natural number) video signal lines.

Number k and number z above can be set independently of each other. In the examples shown in FIGS. 3 and 4, the number k and number z are the same (in the same pixel circuit). Obviously, if number k and number z are different, merely one the two projection patterns appears in one pixel circuit.

If number k and number z is both "1" in the case of FIG. 4, for example, the projection pattern 31 and the projection pattern 33 appear in a pixel circuit located at the intersection between an odd-numbered pixel control line 1 and an odd-number video signal line 3. Also, for example, if number k and number z in the case of FIG. 4 are both "9", then the projection pattern 31 and the projection pattern 33 appear in a pixel circuit located at the intersection between 10q+1 (q being a natural number) pixel control line 1 and 10q+1 video signal line 3.

If number k and number z are both "99" in the case of FIG. 4, for example, the projection pattern 31 and the projection pattern 33 appear in a pixel circuit located at the intersection between 100q+1 (q being a natural number) pixel control line 1 and 100q+1 video signal line 3. Also, for example, it is practicable to determine number k and number z such that the location can be identified in a single or plural pixel units (in this example, the pixel unit is three sub pixels).

Thus, arranging the projection pattern 31 and the projection pattern 33 usable for checking the pixel positions all over the surface in the display area 15 makes it easy to detect given pixel positions and execute positional alignment even on these displays panels which are large in screen size. Especially, the existence of these projection patterns for positional identification in the display area is very helpful for visual inspection.

It should be noted that step D and width W of the projection pattern 31 and the projection pattern 33 may take any values if these values are over manufacturing limit dimensions. For example, as shown in FIG. 5, if the line width of the pixel control line 1 and the video signal line 3 is 10 μm, step D and width W is each 3 μm. Obviously, the patterns may be smaller in dimension by considering identification efficiency in the future.

It should be noted that step D and width W need not be the same; namely, one may longer than the other. Also, the dimensions of the projection pattern 31 and the projection pattern 33 may be increased in a range in which no short circuit is caused with peripheral wiring. Basically, as the dimensions of the projection pattern 31 and the projection pattern 33 get larger, pattern detection can be made more easily. Especially, in the case of visual inspection, the detection is easy. Obviously, the dimensions of the projection pattern 31 and the projection pattern 33 may not be infinitely increased because of the limitation in layout.

Adding the projection pattern 31 and the projection pattern 33 to the pixel control line 1 and the video signal line 3 necessarily increases the capacity of these wirings; however, the increment in capacity is slight as compared with the original capacity of the wirings, so that the effect to the driving operation is almost negligible. It should be noted that, rather than the projection pattern 31 and the projection pattern 33, positional identification marks can be arranged in an island manner in each pixel circuit.

However, in this case, it is not enough merely to allocate a minimum size that is identifiable as a positional identification pattern; therefore, it is necessary to allocate a space large enough for preventing a wire-to-wire short circuit with peripheral wirings. With today's high-resolution pixel circuits, the enough space may not be allocated, which also leads to lowered aperture ratios. From this point of view, the positional identification patterns in the embodiment in which the patterns project directly from the pixel control line 1 and the video signal line 3 are reasonable.

Also, in the above-mentioned embodiment, the projection pattern 31 and the projection pattern 33 are arranged for both the pixel control line 1 and the video signal line 3; it is also practicable to arrange these patterns for merely one of the lines. In this case, the projection pattern 31 or the projection pattern 33 can be arranged in all pixel circuits on the wirings location every k+1 or z+1 line.

(B-2) Other Embodiments

The above-mentioned embodiment has been described by use of an example in which the positional identification patterns are rectangular projection patterns. It is also practicable to use other shapes and structures, such as shown in FIGS. 6A through 6E.

Figure 6B:
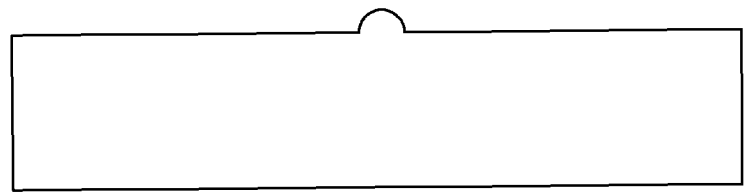
Figure 6C:
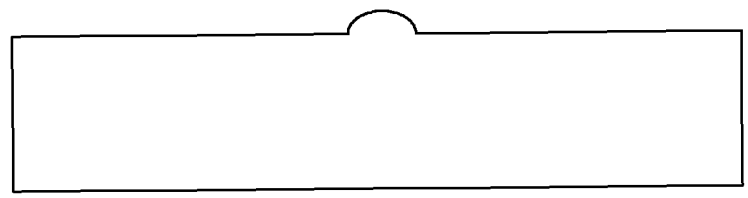
Figure 6D:
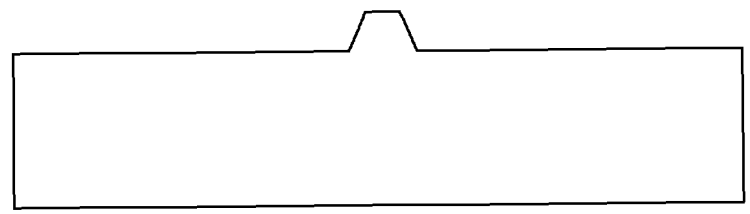

To be more specific, structures for positional identification may include a triangular projection as shown in FIG. 6A, a semicircular projection as shown in FIG. 6B, an elliptical projection as shown in FIG. 6C, or a trapezoidal projection as shown in FIG. 6D.

Figure 7A:
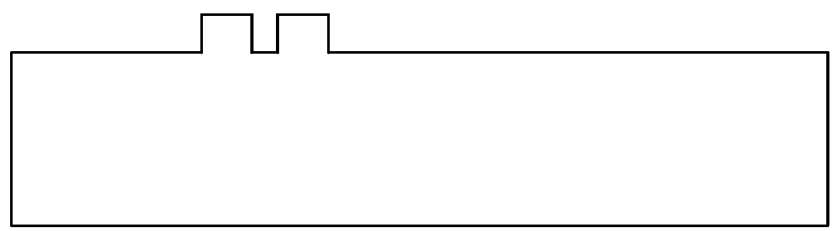
FIGS. 7A and 7B are schematic diagrams illustrating other exemplary forms of positional identification patterns.
Figure 7B:
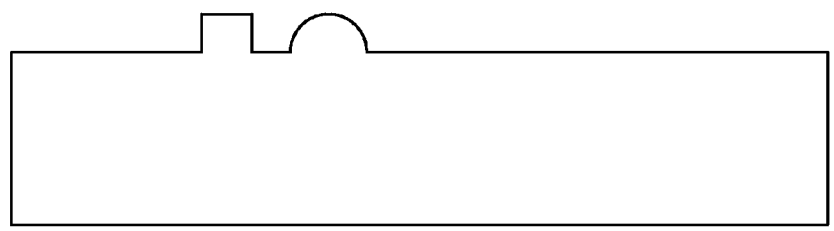

Also, the above-mentioned embodiment has been described in the case in which one projection pattern is arranged. It is also practicable, as shown in FIG. 7A, to provide a configuration in which two projection patterns are arranged. Alternatively, as shown in FIG. 7B, two types of projection patterns having different shapes can be used. Obviously, three or more projection patterns can be arranged in principle.

Figure 8A:
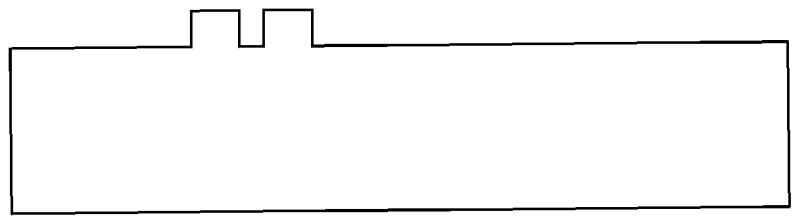
FIGS. 8A and 8B are schematic diagrams illustrating still other exemplary forms of positional identification patterns.
Figure 8B:
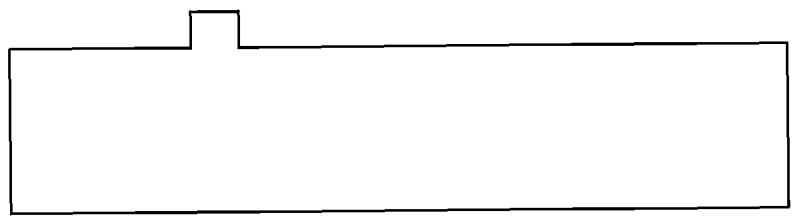

One of the two types of projection patterns shown in FIGS. 8A and 8B can be used in accordance with the location of arrangement. In this case, understanding the occurrence location and occurrence frequency of the two types of projection patterns in advance facilitates the identification of the positional relationship inside the display area even if the imaging field of view is narrow.

For example, using different patterns in accordance with the difference of TABs and driver ICs mounted on the outer periphery of the display area 15 allows the understanding of the approximate positional relationship inside the screen because of the difference between the positional identification patterns observed inside the display area.

Figure 9A:
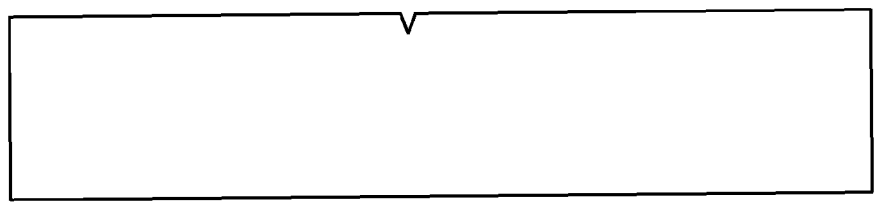
FIGS. 9A and 9B are schematic diagrams illustrating yet other exemplary forms of positional identification patterns.
Figure 9B:
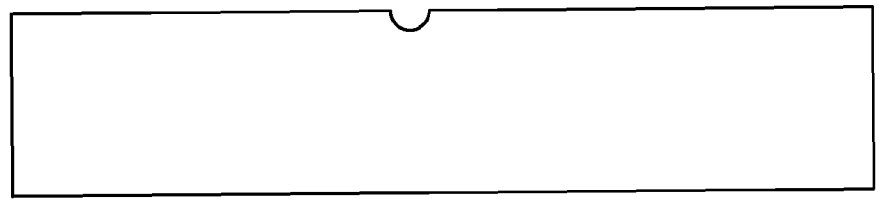

It should be noted that, in the description of the above-mentioned embodiment, convex patterns were illustrated as the structure for positional identification; it is also practicable to use a concave pattern as shown in FIG. 9. For example, a triangular cut pattern as shown in FIG. 9A or a semicircular cut pattern a shown in FIG. 9B may be used.

(C) Panel Inspection Apparatus (C-1) Embodiment 1

Figure 10:
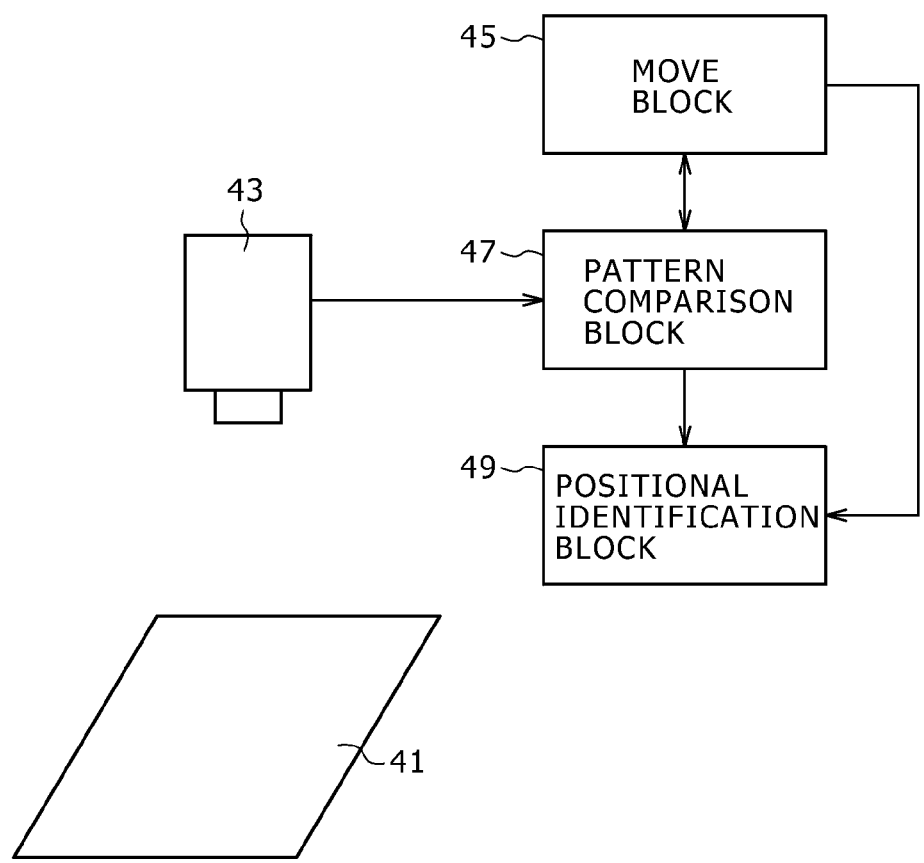
FIG. 10 is a schematic diagram illustrating an exemplary panel inspection apparatus.

Referring to FIG. 10, there is shown an exemplary inspection apparatus configured to inspect an organic EL panel 41 with the above-mentioned positional identification pattern formed inside the display area. It should be noted that FIG. 10 shows a panel inspection apparatus having capabilities of detecting the positional coordinates of failing pixels.

Therefore, FIG. 10 shows merely a functional block configuration associated with the capabilities of detecting the positional coordinates of every detected failing pixel. The panel inspection apparatus shown in FIG. 10 has an imaging camera 43, a move block 45, a pattern comparison block 47, and a positional identification block 49.

It should be noted that the imaging camera 43 is an imaging device that has a magnifying capability equivalent to a microscope. The move block 45 is a movable device that relatively moves the organic EL panel 41 and the imaging camera 43.

The move block 45 is configured as a movable device that is a base on which the organic EL panel 41 is mounted or a movable device that is a movable mechanism on which the imaging camera 43 is mounted. It should be noted that the move block 45 associated with the present embodiment is assumed to be movable within a range equivalent to the occurrence period of positional identification pattern as well as movable within an imaging rang.

The pattern comparison block 47 is a processing unit configured to execute comparison between imaging pattern and positional identification pattern. The positional identification block 49 is a processing unit configured to identify pixel positions, in an organic EL panel, of a movement start position on the basis of a distance from movement start to movement end.

Figure 11:
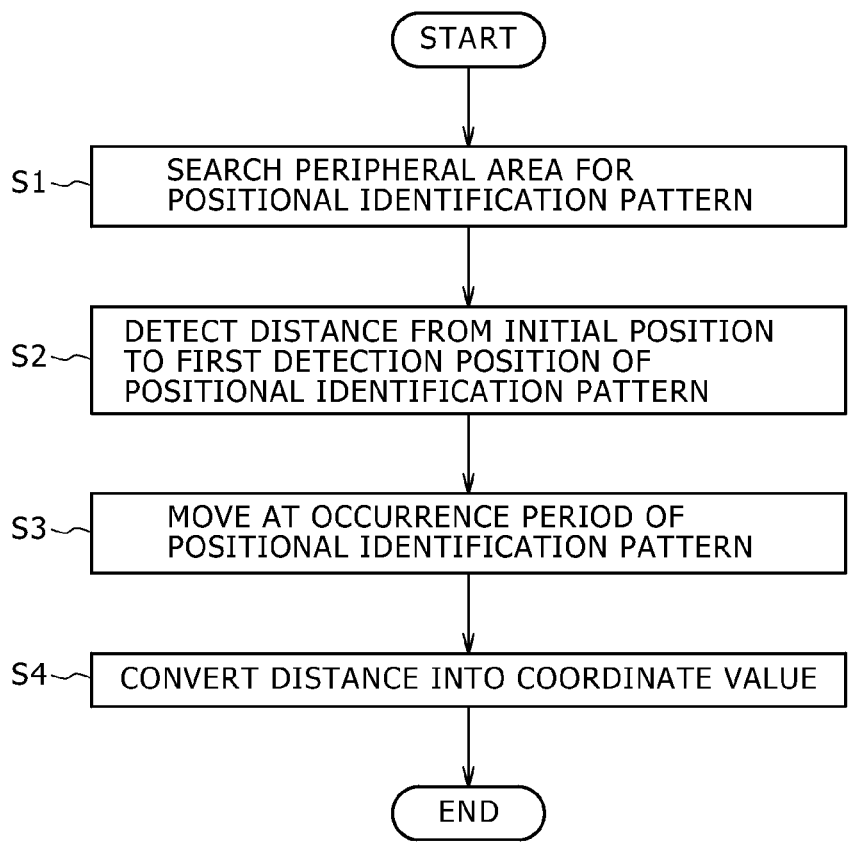
FIG. 11 is a flowchart indicative of an exemplary inspection procedure.

Referring to FIG. 11, there is shown a positional detecting operation to be executed by the above-mentioned panel inspection apparatus. It should be noted that, in FIG. 11, an imaging range of the imaging camera 43 is assumed already positioned to a failing point by failure inspection processing.

In this state, the panel inspection apparatus moves the imaging range in a range of the occurrence period of positional identification pattern around the current failing pixel so as to search for a positional identification pattern around the failing pixel (process S1).

It should be noted that this positional identification pattern search processing is executed by the pattern comparison block 47. In this search processing, the pattern comparison block 47 and the move block 45 operate in an interlocking manner so as to set a movable range of imaging range. Movement information in the positional identification pattern search processing is supplied from the move block 45 to the positional identification block 49.

If a positional identification pattern is detected in a range around the failing point, then a distance from the start position of the search operation to the position at which the positional identification pattern has been first detected (process S2) is detected (process S2). This distance is held in the positional identification block 49.

Next, the panel inspection apparatus moves the imaging range at the occurrence period of that positional identification pattern in the direction in which the positional identification pattern orthogonally intersects the first detected wire, thereby counting the number of times the movement has been made (process S3). Next, when the imaging range reaches an outer periphery of the organic EL panel 41, the current move operation stops. At this point of time, the distance from the failing point to the outer periphery of the organic EL panel in a certain direction is established.

The panel inspection apparatus converts this distance into the coordinate information of the failing point (process S4). For example, if the direction of movement is in the orthogonal intersection with the pixel control line 1, the distance from the failing point to the detection of the first positional identification pattern is y in pixel equivalent, and the movement count at the occurrence period of positional identification pattern is n, then the location of the pixel control line 1 having the failure is given by n×(k+1)+y.

It should be noted that if the positional information about the direction in which the movement orthogonally intersects the video signal line 3 is desired, the imaging range can be returned from the outer periphery of the organic EL panel 41 to the failing point again, for example, thereby repeating an operation of detecting the positional identification pattern in the direction of orthogonally intersecting the video signal line 3 and a moving operation thereof.

It is also practicable, for example, by executing a search operation in the direction of orthogonally intersecting the video signal line 3 with the outer periphery of the organic EL panel 41 reached by the movement in the direction of orthogonally intersecting the pixel control line 1 as an origin, to detect the positional identification pattern of the video signal line 3 located around the origin and repeat a moving operation from the detected position at the occurrence period of positional identification pattern, thereby identifying the positional information about the direction of orthogonally intersecting the video signal line 3.

It should be noted that, in the moving operation at the occurrence period of positional identification pattern, an operation of image-detecting the positional identification pattern from the taken image may be executed every time a moving operation is made for the purpose of canceling a movement error; however, if the accuracy of moving operation can be assured, the image processing may be omitted for a shorter moving time. In any case, as compared with the case where wires are counted one by one, these configurations can significantly reduce the time necessary for identifying the pixel position having a failure.

Consequently, the above-mentioned novel methods can realize a shortened manufacturing takt time. Especially, in the case of high-resolution, large-size panels, which have to be inspected over a relatively wide range, a significantly reduced processing time per one unit of panel is expected.

(C-2) Embodiment 2

Figure 12:
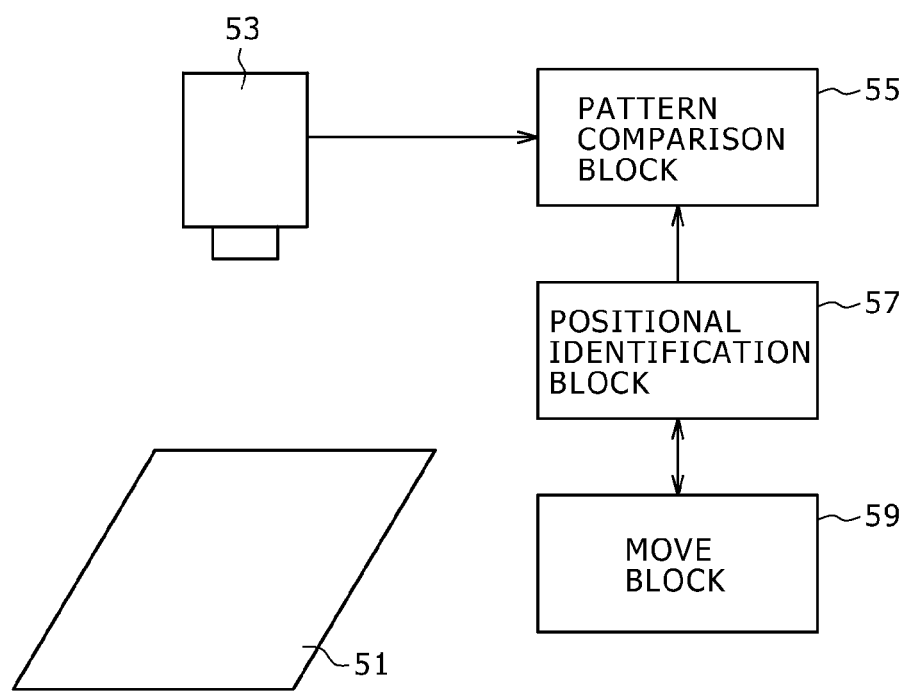
FIG. 12 is a schematic diagram illustrating an exemplary panel inspection apparatus.

Referring to FIG. 12, there is shown an exemplary inspection apparatus for inspecting an organic EL panel 51 with the above-mentioned positional identification pattern formed inside the display area. It should be noted that FIG. 12 shows a panel inspection apparatus having a capability of aligning a repair area with a previously given failing point.

Therefore, FIG. 12 shows merely a functional block configuration associated with the moving function of the repair area. The panel inspection apparatus shown in FIG. 12 has an imaging camera 53, a pattern comparison block 55, a positional identification block 57, and a move block 59.

It should be noted that the imaging camera 53 is an imaging device that has a magnifying capability equivalent to a microscope. The pattern comparison block 55 is a processing unit configured to execute comparison between imaging pattern and positional identification pattern.

The positional identification block 57 is a processing unit configured to identify the current position on the basis of a pattern comparison result. The move block 59 is a movable device that relatively moves the organic EL panel 51 and the imaging camera 53.

The move block 59 is configured as a movable device that is a base on which the organic EL panel 51 is mounted or a movable device that is a movable mechanism on which the imaging camera 53 (including a laser output block, not shown) is mounted. It should be noted that the move block 59 associated with the present embodiment is assumed to be movable within a range equivalent to the occurrence period of positional identification pattern as well as movable within an imaging range.

Figure 13:
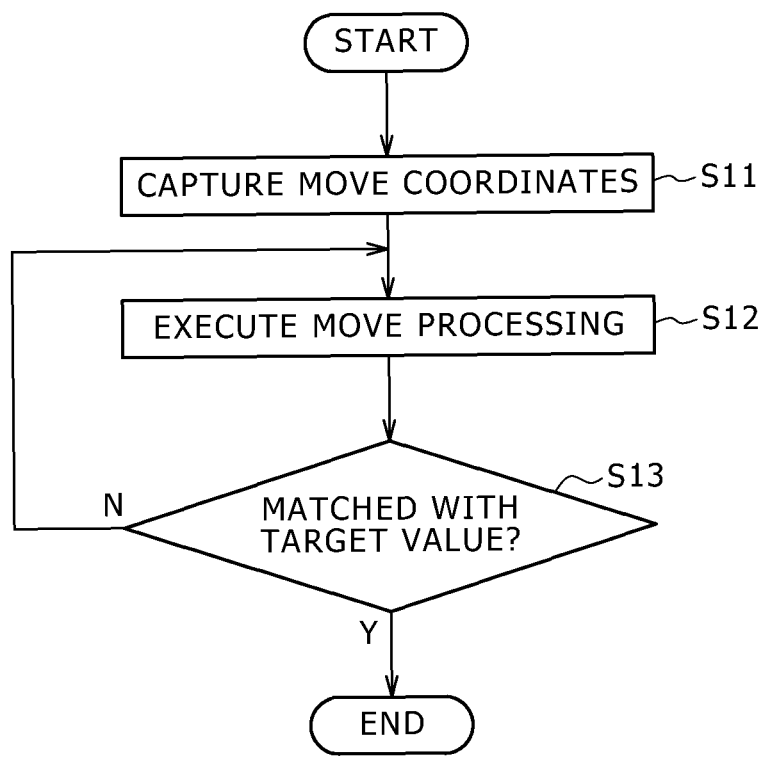
FIG. 13 is a flowchart indicative of an exemplary inspection procedure.

FIG. 13 shows, a position detecting operation that is executed in the panel inspection apparatus. First, the panel inspection apparatus gets the positional coordinate of the failing point by the previous failure inspection processing (process S11). It is assumed that this coordinate be given for each of the pixel control line 1 and the video signal line 3.

It should be noted that each of these coordinates be given in the number of sub pixels corresponding to the movement count at the occurrence period of positional identification pattern and the distance below the movement period. Having obtained the positional coordinates, the panel inspection apparatus executes an operation of movement to the coordinates corresponding to one of above-mentioned two coordinates (process S12).

For example, the positional coordinate for the selected movement direction is given as n movements at the occurrence period of positional identification pattern and y movements in sub pixel unit, the panel inspection apparatus executes the corresponding number of moving operations.

In doing so, at the time of movement at the occurrence period of positional identification pattern, pattern comparison with the taken image may also be executed for checking the distance. Obviously, if the accuracy in movement is high, the comparison of this type may be omitted to repeat the moving operation by the given number of movements.

It should be noted that the moving operation is repeatedly executed while a negative decision is obtained in the decision processing (process S13) whether there is a match between the distance and a target value every time the moving operation is executed. Obviously, after the completion of the movement to one movement direction, moving operations in other directions are repeated.

Thus, in the case of the organic EL panel 51 formed with positional identification patterns, the speed of moving operation and the accuracy of positioning can be enhanced also during each moving operation by the identification and counting of positional identification patterns as desired. As a result, the manufacturing takt time can be reduced. Especially, in the case of high-resolution, large-size panels, which have to be inspected over a relatively wide range, a significantly reduced processing time per one unit of panel is expected.

(D) Article Examples (D-1) Panel Forms

In the above description, the organic EL module 11 having the configuration shown in FIG. 2 was described. However, the embodiment of the present invention is also applicable to any panels having a form in which the scan signal supply TAB 17 and the video signal supply TAB 19 are removed from the organic EL module 11.

(D-2) Electronic Devices

The above-mentioned organic EL module 11 is distributed in the form an article mounted on various kinds of electronic devices. The following shows some mounting examples on other electronic devices than mentioned above.

Figure 14:
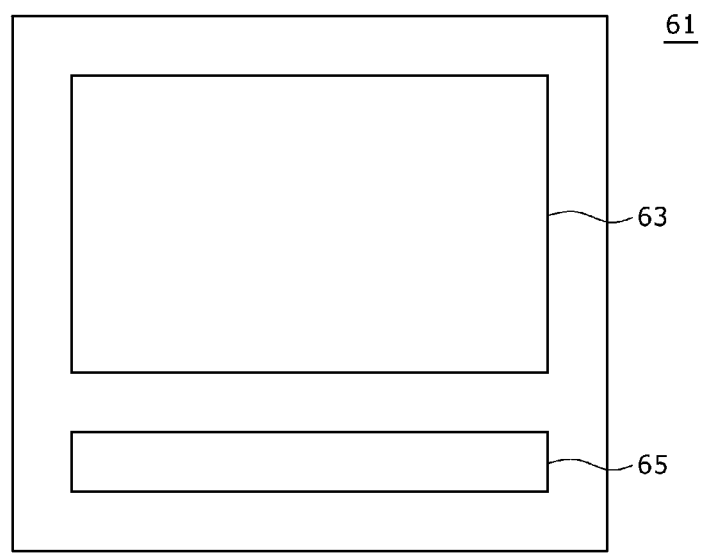
FIG. 14 is a schematic diagram illustrating an exemplary functional configuration of an electronic device.

Referring to FIG. 14, there is shown an exemplary system configuration of an electronic device. As shown in FIG. 14, an electronic device 61 is made up of a display panel module 63 having a panel structure described above and a system control block 65. The system control block 65 is a processing unit configured to control the entire system of the electronic device and is made up of a CPU (Central Processing Unit), for example. In addition, the system control block 65 is made up of an interface according to the application of the electronic device.

Figure 15:
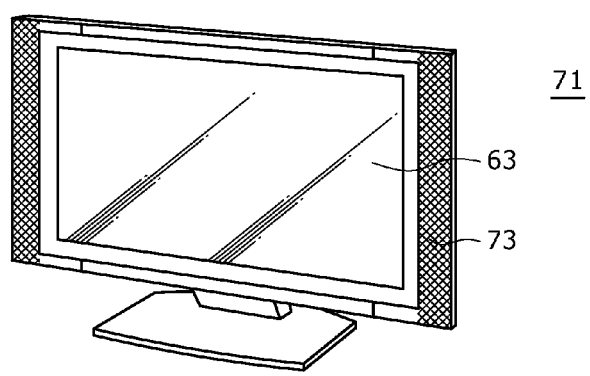
FIG. 15 is a perspective view of an exemplary article.

Referring to FIG. 15, there is shown an exemplary external view of an electronic device when the electronic device is a television set. A television set 71 shown in FIG. 15 has a structure in which a display panel module 63 is arranged in front of a front panel 73.

Figure 16A:
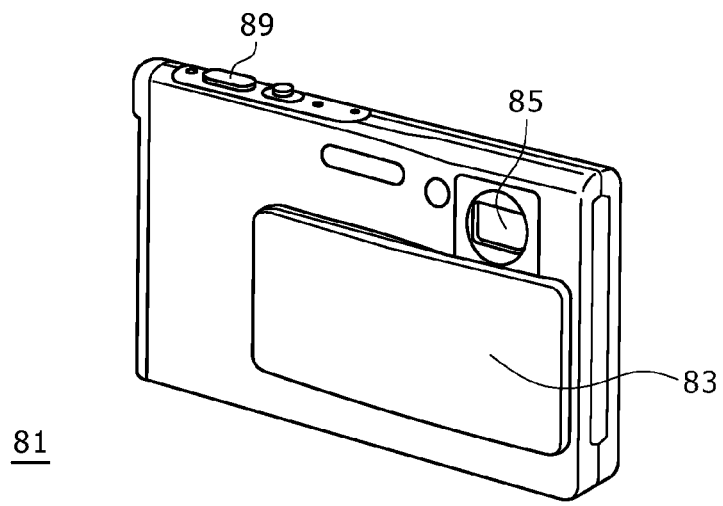
FIGS. 16A and 16B are perspective views of another exemplary article.
Figure 16B:
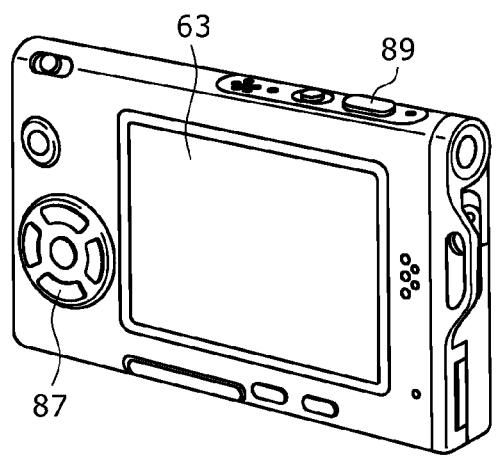

Referring to FIGS. 16A and 16B, there are shown exemplary external views of an electronic device that is a digital camera. FIG. 16A shows the front side (or the subject side) of the digital camera, while FIG. 16B shows the rear side (or the photographer side) of the digital camera.

A digital camera 81 has a protection cover 83, a taking lens block 85, a display panel module 63, a control switch 87, a shutter button 89, and so on.

Figure 17:
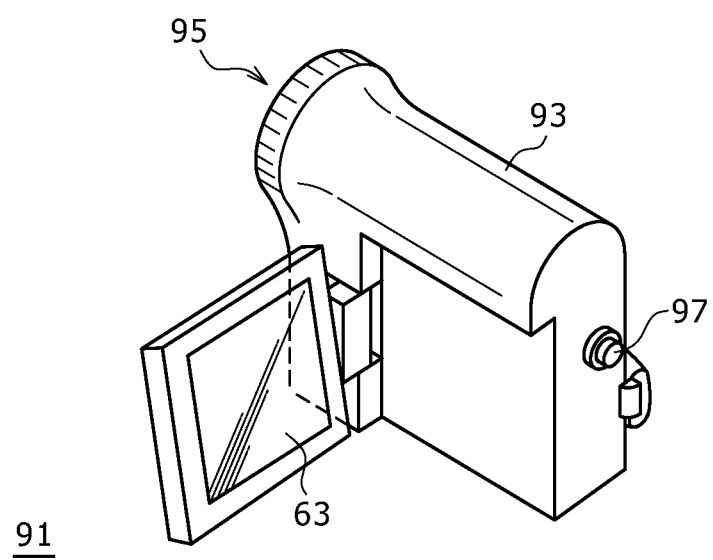
FIG. 17 is a perspective view of still another exemplary article.

Referring to FIG. 17, there is shown an exemplary external view of an electronic device that is a video camera. A video camera 91 has, on the front side of a main body 93, a taking lens 95 for taking an image of a subject, an imaging start/stop switch 97, and a display panel module 63.

Figure 18A:
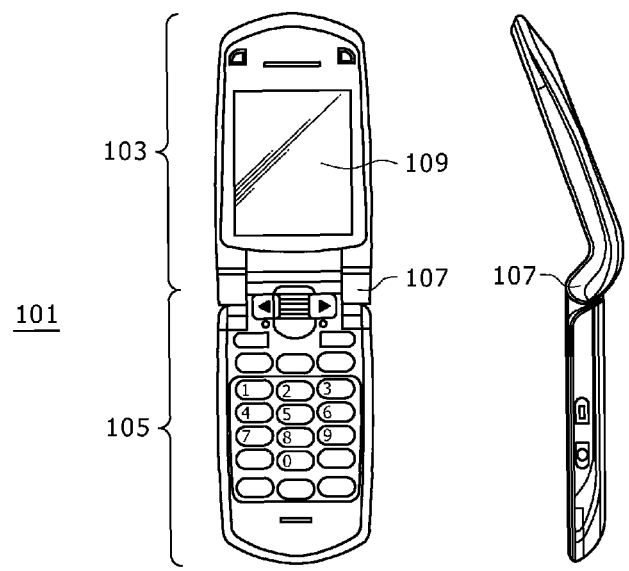
FIGS. 18A and 18B are perspective views of yet another exemplary article.
Figure 18B:
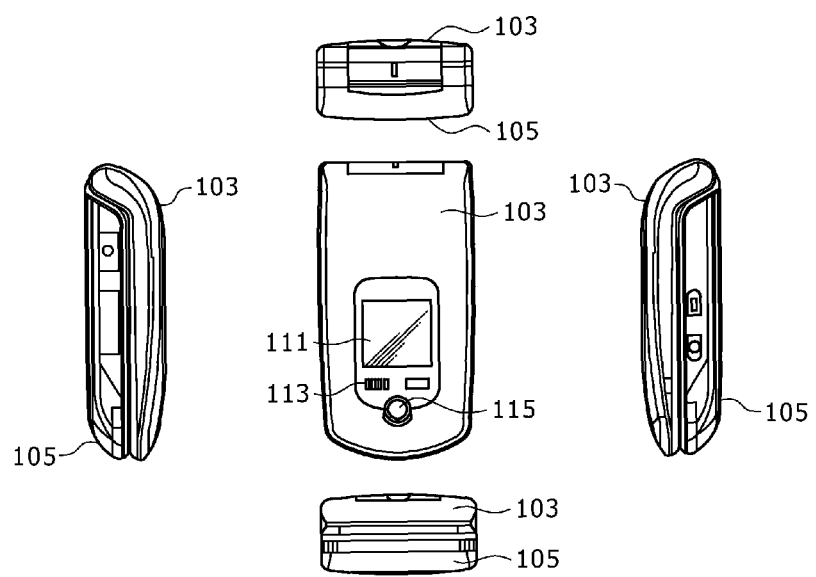

Referring to FIGS. 18A and 18B, there are shown exemplary external views of an electronic device that is a mobile phone. A mobile phone 101 shown in these figures is of a folding type. FIG. 18A shows an open state, while FIG. 18B shows a closed state.

The mobile phone 101 has an upper housing 103, a lower housing 105, a coupling block (in this example, a hinge block) 107, a main display module 109, an auxiliary display panel module 111, a picture light 113, and a taking lens 115. It should be noted that the main display panel module 109 and the auxiliary display panel module 111 corresponding to the display panel module 63.

Figure 19:
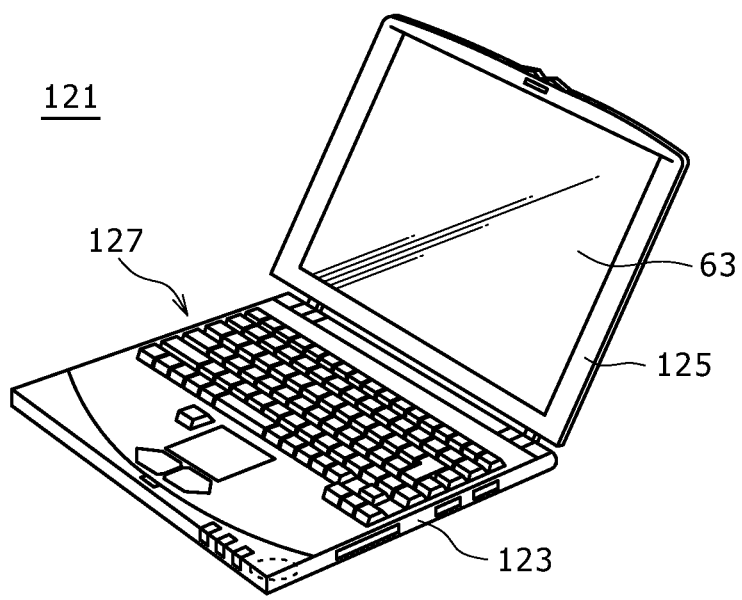
FIG. 19 is a perspective view of a different exemplary article.

Referring to FIG. 19, there is shown an exemplary external view of an electronic device that is a computer. A computer 121 has a lower housing 123, an upper housing 125, a keyboard 127, and a display panel module 63.

In addition to the above-mentioned electronic devices, the display panel module 63 is applicable to audio reproducing apparatuses, game machines, electronic books, electronic dictionaries, and so on.

(D-3) Other Display Devices

With the above-mentioned embodiments, the display modules are organic EL panels. It should be noted that the above-mentioned panel structure is also applicable to self-illuminating display panel modules and non self-illuminating display panel modules other than organic EL panel modules.

(D-4) Other

While preferred embodiments of the embodiment of the present invention have been described using specific terms, such description is for illustrative purpose, and it is to be understood that changes and variations may be made without departing from the spirit or scope of the following claims.

What is claimed is:

1. A display device having a display panel based on active matrix driving, the display panel comprising:
   a plurality of pixel control lines extending in a first direction,
   a plurality of video signal lines extending in a second direction that is orthogonal to the first direction,
   a plurality of pixel circuits arranged at intersections of the pixel control lines and the video signal lines, and
   a plurality of first positional identification patterns for identifying locations of the pixel circuits, wherein the first positional identification patterns are arranged in a frequency of z video signal lines (z being a natural number) such that the first positional identification patterns identify relative locations of corresponding ones of the pixel circuits along the first direction, and wherein the display panel is a self-illuminating display panel.

2. The display device according to claim 1, wherein the display panel is an organic EL display panel.

3. The display device according to claim 1, wherein each of the first positional identification patterns is respectively arranged so as to identify a location of a corresponding pixel circuit in a single or plural pixel units, and each of the pixel units comprises a plurality of sub pixels.

4. The display device according to claim 3, wherein each of the pixel units comprises sub pixels corresponding to R (Red), G (Green), and B (Blue).

5. The display device according to claim 3, wherein each of the first positional identification patterns are arranged in a frequency of z video signal lines so as to identify a location of the corresponding pixel circuit in a single pixel unit.

6. The display device according to claim 1, wherein the display panel has a display area, the pixel circuits are arranged in the display area, and peripheral circuits are connected to the display area at the outer periphery of the display area.

7. The display device according to claim 1, wherein the display panel further comprises a plurality of second positional identification patterns whose shapes are different from shapes of the first positional identification patterns, and the difference of patterns identifies the difference of types of the peripheral circuits connected to each corresponding pixel circuit.

8. The display device according to claim 6, wherein the display panel further comprises an organic film, a cathode film and an opposite substrate.

9. The display device according to claim 6, wherein the first positional identification patterns are also arranged in the display area.

10. The display device according to claim 9, wherein each of the first positional identification patterns is respectively arranged within a corresponding one of the pixel circuits.

11. The display device according to claim 6, wherein the display panel comprises a glass substrate.

12. The display device according to claim 8, wherein an area of the organic film is greater than the display area.

13. The display device according to claim 1, wherein each of the first positional identification patterns are in a form selected from the group consisting of a convex shape, a concave shape, an island manner, a triangular projection, and a semicircular projection.

14. The display device according to claim 9, wherein the first positional identification patterns are arranged on an entire range of the display area in a dispersed manner.

15. The display device according to claim 6, wherein the peripheral circuits are mounted on the display panel at the outer periphery of the display area.

16. The display device according to claim 15, wherein each of the peripheral circuits is implemented in at least one of a TAB or a driver IC.

17. A display device having a display panel based on active matrix driving, the display panel comprising:
   a plurality of pixel control lines extending in a first direction,
   a plurality of video signal lines extending in a second direction that is orthogonal to the first direction,
   a plurality of pixel circuits arranged at intersections of the pixel control lines and the video signal lines, and
   a plurality of first positional identification patterns for identifying locations of the pixel circuits, wherein the first positional identification patterns are arranged in a frequency of k pixel control lines (k being a natural number) such that the first positional identification patterns identify relative locations of corresponding ones of the pixel circuits along the second direction, and wherein the display panel is a self-illuminating display panel.

18. The display device according to claim 17, wherein the display panel has a display area, and the pixel circuits are arranged in the display area.

19. The display device according to claim 18, wherein the display panel further comprises an organic film, a cathode film and an opposite substrate.

20. The display device according to claim 18, wherein the first positional identification patterns are also arranged in the display area.

21. The display device according to claim 20, wherein each of the first positional identification patterns is respectively arranged within a corresponding one of the pixel circuits.

22. The display device according to claim 19, wherein an area of the organic film is greater than the display area.

23. The display device according to claim 18, wherein peripheral circuits are connected to the display area at the outer periphery of the display area.

* * * * *